(12) United States Patent
Sun (10) Patent No.: US 10,911,883 B1
(45) Date of Patent: Feb. 2, 2021

(54) STEREO AUDIO DEVICE OF MOBILE TERMINAL (71) Applicant: BEIJING XIAOMI MOBILE SOFTWARE CO., LTD., Beijing (CN)

(72) Inventor: Changyu Sun, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/841,706

(22) Filed: Apr. 7, 2020

(30) Foreign Application Priority Data

Oct. 23, 2019 (CN) .......................... 2019 1 1012211

(51) Int. Cl.
*H04S 7/00* (2006.01)
*H04R 5/04* (2006.01)
*G10L 19/008* (2013.01)

(52) U.S. Cl.
CPC ............ *H04S 7/301* (2013.01); *G10L 19/008* (2013.01); *H04R 5/04* (2013.01); *H04S 2400/01* (2013.01); *H04S 2400/15* (2013.01)

(58) Field of Classification Search
CPC .......... H04S 3/00; H04S 7/00; H04S 2400/01; H04S 7/30; H04S 7/308; H04S 1/00; H04S 2400/15; H04R 1/1041; H04R 5/04; H04R 2420/05; H04R 3/00; H04R 3/12; H04R 2420/03; H04R 2201/107; H04R 2420/01; H04R 2499/11; H04R 25/30; H04R 25/356; G10L 19/008; H03G 3/20; H03G 3/3005; H03G 3/007

USPC ... 381/1, 22, 59, 120, 300, 311, 56, 58, 94.5
See application file for complete search history.

(56) References Cited

U.S. PATENT DOCUMENTS 4,079,333 A * 3/1978 Yamada .................... H03F 3/68
                                                              330/124 R
8,514,025 B2    8/2013 Lesso

FOREIGN PATENT DOCUMENTS

TW       201117544 A     5/2011
WO    2004091091 A1    10/2004

OTHER PUBLICATIONS

Extended European search report of counterpart EP application No. 20171500.0 dated Oct. 15, 2020.
Zheren Lai et al, A low distortion switching audio power amplifier; Power Electronics Specialists Conference, vol. 1, Jun. 18, 1995 (Jun. 18, 1995), pp. 174-180, entire document.

* cited by examiner

*Primary Examiner* — Norman Yu
(74) *Attorney, Agent, or Firm* — Syncoda LLC; Feng Ma (57) ABSTRACT

A power control method includes: acquiring an offset between a time sequence signal of a left sound channel power supply and a time sequence signal of a right sound channel power supply; determining a delay time of a time sequence signal of a first sound channel power supply based on the offset and a target offset; and delaying the time sequence signal of the first sound channel power supply by the delay time to meet the target offset.

20 Claims, 5 Drawing Sheets

STEREO AUDIO DEVICE OF MOBILE TERMINAL

CROSS-REFERENCE TO RELATED APPLICATION

This application claims priority to Chinese Patent Application 201911012211.6, filed on Oct. 23, 2019, the disclosure of which is hereby incorporated herein by reference in its entirety.

BACKGROUND

Stereo refers to the sound having a stereoscopic effect. In electronic equipment, the stereo is often implemented by two channels. A two-channel audio device has two loudspeakers, each loudspeaker being individually supplied with signals from one channel. As signals of the two channels are different in phase, the difference between two human ears when hearing sound in nature may be simulated.

SUMMARY

The present disclosure relates generally to the field of electronics technologies, and more specifically to a stereo audio device of a mobile terminal.

Embodiments of the present disclosure provide a stereo audio device, a power control method, and a mobile terminal.

According to an aspect of embodiments of the present disclosure, a power control method for a stereo audio device is provided. The method includes:

acquiring an offset between a time sequence signal of a left sound channel power supply and a time sequence signal of a right sound channel power supply, the left sound channel power supply and the right sound channel power supply both being switch power supplies, and the time sequence signal being used for controlling on and off of transistors in the switch power supplies;

determining a delay time of a time sequence signal of a first sound channel power supply based on the offset and a target offset, the first sound channel power supply being one of the left sound channel power supply and the right sound channel power supply; and delaying the time sequence signal of the first sound channel power supply by the delay time to meet the target offset; wherein when the offset between the time sequence signal of the left sound channel power supply and the time sequence signal of the right sound channel power supply is the target offset, a peak of superposed ripples generated by the left sound channel power supply and the right sound channel power supply is not greater than a peak of ripple generated by one of the left sound channel power supply and the right sound channel power supply.

According to an aspect of embodiments of the present disclosure, a stereo audio device is provided. The device includes:

a processor;

a memory for storing a processor-executable instruction, wherein the processor is configured to load and execute the executable instruction and to:

acquire an offset between a time sequence signal of a left sound channel power supply and a time sequence signal of a right sound channel power supply, the left sound channel power supply and the right sound channel power supply both being switch power supplies, and the time sequence signal being used for controlling on and off of transistors in the switch power supplies;

determine a delay time of a time sequence signal of a first sound channel power supply based on the offset and a target offset, the first sound channel power supply being one of the left sound channel power supply and the right sound channel power supply; and delay the time sequence signal of the first sound channel power supply by the delay time to meet the target offset; wherein when the offset between the time sequence signal of the left sound channel power supply and the time sequence signal of the right sound channel power supply is the target offset, a peak of superposed ripples generated by the left sound channel power supply and the right sound channel power supply is not greater than a peak of ripples generated by one of the left sound channel power supply and the right sound channel power supply.

According to an aspect of embodiments of the present disclosure, a stereo audio device is provided. The device includes:

a processor;

a memory for storing a processor-executable instruction, wherein the processor is configured to load and execute the executable instruction to implement the power control method for the stereo audio device above.

According to an aspect of the embodiment of the present disclosure, a mobile terminal is provided, and the mobile terminal includes a stereo audio device, the device includes:

a processor;

a memory for storing a processor-executable instruction, wherein the processor is configured to load and execute the executable instruction and to:

acquire an offset between a time sequence signal of a left sound channel power supply and a time sequence signal of a right sound channel power supply, the left sound channel power supply and the right sound channel power supply both being switch power supplies, and the time sequence signal being used for controlling on and off of transistors in the switch power supplies;

determine a delay time of a time sequence signal of a first sound channel power supply based on the offset and a target offset, the first sound channel power supply being one of the left sound channel power supply and the right sound channel power supply; and delay the time sequence signal of the first sound channel power supply by the delay time to meet the target offset; wherein when the offset between the time sequence signal of the left sound channel power supply and the time sequence signal of the right sound channel power supply is the target offset, a peak of superposed ripples generated by the left sound channel power supply and the right sound channel power supply is not greater than a peak of ripple generated by one of the left sound channel power supply and the right sound channel power supply.

It is to be understood that both the foregoing general description and the following detailed description are exemplary and explanatory only and are not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Exemplary embodiments will be described in detail herein, examples of which are illustrated in the accompanying drawings. The following description refers to the accompanying drawings in which the same numbers in different drawings represent the same or similar elements unless otherwise indicated. The implementations set forth in the following exemplary embodiments do not represent all implementations consistent with the present invention. Rather, they are merely examples of devices and methods consistent with certain aspects of the present invention as detailed in the appended claim.

Figure 1:
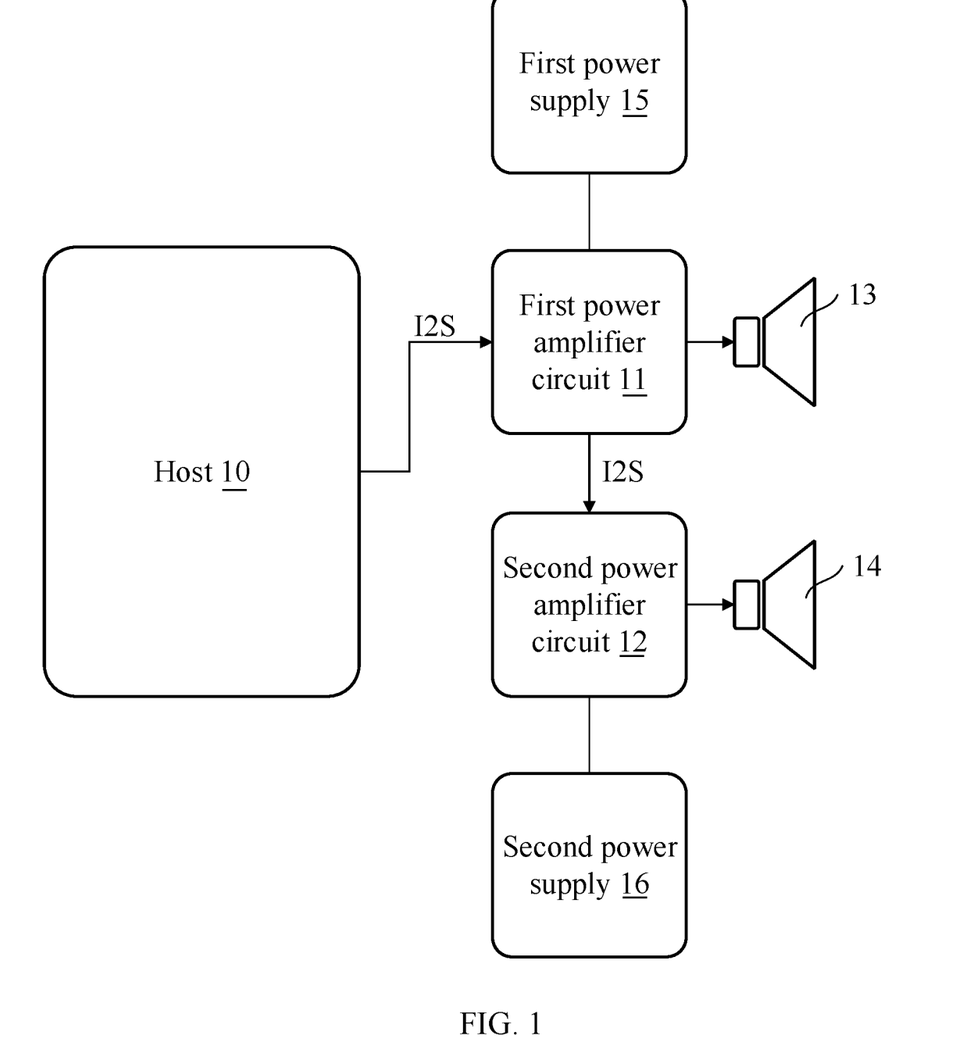
FIG. 1 is a block diagram of a stereo audio playback system according to some embodiments of the present disclosure.

FIG. 1 is a block diagram of a stereo audio playback system according to some embodiments of the present disclosure. As shown in FIG. 1, the system may include a host 10, a first power amplifier circuit 11, a second power amplifier circuit 12, a first loudspeaker 13, and a second loudspeaker 14. The first power amplifier circuit 11, the second power amplifier circuit 12, the first loudspeaker 13 and the second loudspeaker 14 are usually packaged as an audio device, such as a loudspeaker box or a loudspeaker unit of an apparatus.

The host 10 herein may be a mobile terminal, a computer host, or other electronic equipment. Exemplarily, the host may be a cell phone, and the audio device is the loudspeaker unit of the cell phone.

An audio signal generated by the host 10 is transmitted to the first power amplifier circuit 11 through an IIS (Inter-IC Sound) bus. The audio signal includes a channel selection (WS) signal, a clock (CLK) signal, an output (OUT) signal, and an input (IN) signal. The OUT signal includes both a left sound channel signal and a right sound channel signal that are distinguished from each other by the WS signal. Generally, a cycle of the audio signal is divided into two half cycles, with the OUT signal in one half cycle being the left sound channel signal and OUT signal in the other half cycle being the right sound channel signal. Exemplarily, when the WS signal is 1, the corresponding OUT signal is the left sound channel signal; and when the WS signal is 0, the corresponding OUT signal is the right sound channel signal. The role of the IN signal is echo detection, which is implemented by inputting the IN signal to the host 10 through the power amplifier circuit to thereby detect noise signals generated by the power amplifier circuit and the like.

Based on the WS signal, the first power amplifier circuit 11 may control the first loudspeaker to output sound by one of the left sound channel signal and the right sound channel signal. In addition, the first power amplifier circuit 11 may transmit the other of the left sound channel signal and the right sound channel signal to the second power amplifier circuit 12 based on the WS signal, so that the second power amplifier circuit 12 may control the second loudspeaker to output sound. Herein, the first power amplifier circuit 11 may be referred to as a primary power amplifier circuit, and the second power amplifier circuit 12 may be referred to as a secondary power amplifier circuit. Exemplarily, the first power amplifier circuit 11 may include a switch selection circuit or a processor. Based on the WS signal, the switch selection circuit or the processor controls whether the audio signal that is amplified is output to the first loudspeaker or the second power amplifier circuit 12. The first power amplifier circuit 11 is configured to amplify energy of one sound channel signal in the audio signal, and then drive one loudspeaker to work and output sound. The second power amplifier circuit 12 is configured to amplify energy of the other sound channel signal in the audio signal, and then drive the other loudspeaker to work and output sound.

Referring to FIG. 1, the audio device further includes a first power supply 15 for supplying power to the first power amplifier circuit 11 and the first loudspeaker 13, and a second power supply 16 for supplying power to the second power amplifier circuit 12 and the second loudspeaker 14. One of the first power supply 15 and the second power supply 16 is the left sound channel power supply, and the other is the right sound channel power supply.

Figure 2:
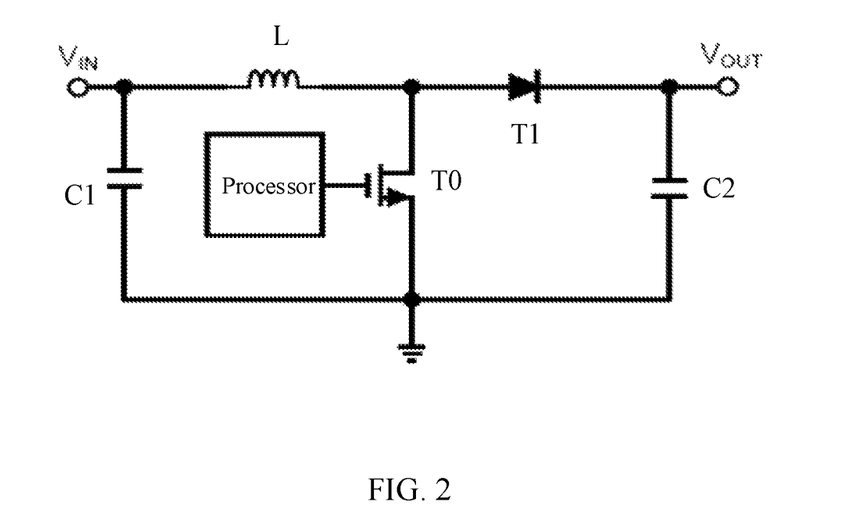
FIG. 2 is a circuit diagram of a boost circuit power supply according to some embodiments of the present disclosure.

Generally, the first power supply 15 and the second power supply 16 in the audio device are both switch power supplies. Exemplarily, both of the first power supply 15 and the second power supply 16 are boost circuit power supplies, which may generate power supply ripples that cannot be eliminated during operation. FIG. 2 is a circuit diagram of a boost circuit power supply according to some embodiments of the present disclosure. Referring to FIG. 2, the boost circuit power supply generates a voltage signal varying in cycles by controlling on and off of a switch T0. The switch T0 is a transistor, and has a control terminal that may be controlled by the processor in the power amplifier circuit.

The ripple formula of the power supply is shown in formula (1):

$$\Delta i_L = \frac{V_{IN} - V_{sw}}{L} \frac{D}{f_s}. \qquad (1)$$

In the formula (1), $\Delta i_L$ refers to current amplitude of the ripple; $V_{in}$ refers to input voltage of the circuit; $V_{sw}$ refers to source-drain voltage of the transistor T0 in the circuit; L refers to magnitude of the inductor; D refers to duty ratio; and $f_s$ refers to frequency.

Figure 3:
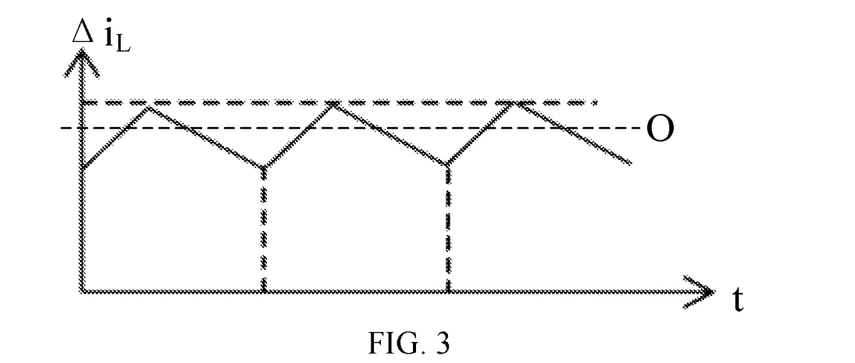
FIG. 3 is a waveform diagram of ripples according to some embodiments of the present disclosure.

FIG. 3 is a waveform diagram of ripples according to some embodiments of the present disclosure. Referring to FIG. 3, the ripple varies in cycles, and the current corresponding to O is 0. Thus, the peak of the ripple current is positive, and the valley is negative.

In the stereo audio device, since both of the two sound channels are provided with power supplies that both may generate ripples, the ripples of the two power supplies may be superposed at this moment, resulting in a higher power supply ripple. However, the excessive power supply ripple may cause fluctuations of the voltage, and if the fluctuations exceed the voltage range of components, the equipment provided with the audio device, such as some functional modules of a cell phone, may fail to operate normally, or even an automatic shutdown may be caused.

Figure 4:
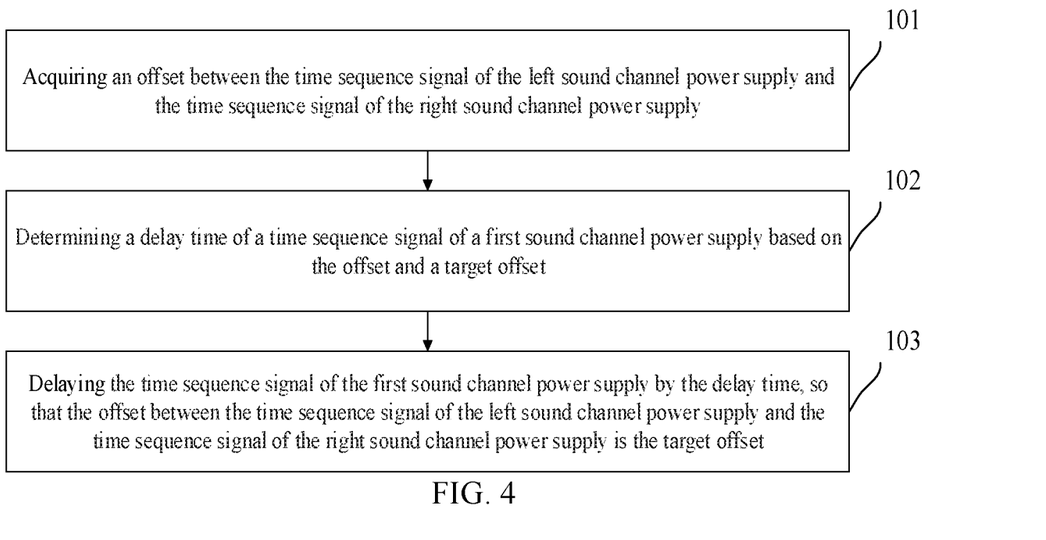
FIG. 4 is a flowchart of a power control method for a stereo audio device according to some embodiments.

FIG. 4 is a flowchart of a power control method for a stereo audio device according to some embodiments. Referring to FIG. 4, the method is executed by the aforesaid audio device, and the method includes steps as follows:

In step 101, an offset between a time sequence signal of a left sound channel power supply and a time sequence signal of a right sound channel power supply is acquired.

As described above, both the left sound channel power supply and the right sound channel power supply are switch power supplies, and the time sequence signal is used for controlling on and off of transistors T0 (that is, switches) in the switch power supplies.

The offset between the time sequence signal of the left sound channel power supply and the time sequence signal of the right sound channel power supply may also be a time difference between a first rising edge or falling edge of the time sequence signal of the left sound channel power supply and the time sequence signal of the right sound channel power supply. The time difference is a time difference between a first peak of the ripple of the left sound channel power supply and a first peak of the ripple of the right sound channel power supply. The first herein refers to the first peak after the processor controls the switch power supply to work with the time sequence signal.

In step 102, a delay time of a time sequence signal of a first sound channel power supply is determined based on the offset and a target offset.

The first sound channel power supply is one of the left sound channel power supply and the right sound channel power supply. That is, the method may be executed by the processor of the power amplifier circuit corresponding to the left sound channel power supply, or by the processor of the power amplifier circuit corresponding to the right sound channel power supply.

In step 103, the time sequence signal of the first sound channel power supply is delayed by the delay time, so that the offset between the time sequence signal of the left sound channel power supply and the time sequence signal of the right sound channel power supply is the target offset.

When the offset between the time sequence signal of the left sound channel power supply and the time sequence signal of the right sound channel power supply is the target offset, the peak of superposed ripples generated by the left sound channel power supply and the right sound channel power supply is less than or equal to the peak of ripple generated by the left sound channel power supply or the right sound channel power supply.

As the waveform of a power supply ripple may be measured in advance, the time difference between the two ripples may be determined within a certain range based on the waveform, so that the peak of the two superposed ripples may be less than or equal to the peak of the ripples generated by the left sound channel power supply or the right sound channel power supply. In addition, the time difference between the ripples corresponds to the offset between the time sequence signals. Thus, the target range of the time difference between the two ripples may be determined in advance to then determine the target range of the offset between the time sequence signals, the aforesaid target offset falling within the target range.

The audio device adopts the delayed time sequence signal of the first sound channel power supply to control the switch of the first sound channel power supply.

In the embodiments of the present disclosure, left and right sound channels of the stereo audio device are powered by independent switch power supplies. The power supplies may generate ripples during operation, and the superposition of ripples generated by two independent power supplies will strengthen this kind of interference. According to the embodiments of the present disclosure, by acquiring the offset between the time sequence signals of the two power supplies, the time sequence signal of one power supply is controlled to be delayed, so that the peak of superposed ripples generated by the left sound channel power supply and the right sound channel power supply is less than or equal to the peak of ripple generated by the left sound channel power supply or the right sound channel power supply, thereby reducing the ripple interference and avoiding incapability of operation caused by excessive ripple fluctuations.

In some embodiments, acquiring the offset between the time sequence signal of the left sound channel power supply and the time sequence signal of the right sound channel power supply includes:

respectively acquiring time of first rising or falling edges of the time sequence signal of the left sound channel power supply and the time sequence signal of the right sound channel power supply by referring to a clock signal of an audio signal of the stereo audio device; and determining the offset between the time sequence signal of the left sound channel power supply and the time sequence signal of the right sound channel power supply based on the time of the first rising or falling edges of the time sequence signal of the left sound channel power supply and the time sequence signal of the right sound channel power supply.

In this implementation, since processors of the two power amplifier circuits control the operation of two power supplies separately and have no synchronization signal therebetween, the offset between the time sequence signals of the left sound channel power supply and the right sound channel power supply is random each time. Therefore, each time this method is adopted, the offset between the time sequence signals of the left sound channel power supply and the right sound channel power supply must be determined firstly. In particular, the clock signal of the audio signal may be taken as a reference. Then, with the reference, the time of the first rising or falling edges of the time sequence signal of the left sound channel power supply and the time sequence signal of the right sound channel power supply may be acquired, so that the offset may then be determined based on the time of the first rising edge or falling edges as acquired. In addition, by taking the clock signal of the audio signal as the reference, it can be ensured that the time of the first rising or falling edges of the time sequence signal of the left sound channel power supply and the time sequence signal of the right sound channel power supply is acquired by taking the same time reference as the reference, with can ensure that the offset between time sequence signals of the two power supplies can be accurately determined each time, thereby making it ready for subsequent control.

In some embodiments, respectively acquiring the time of the first rising or falling edges of the time sequence signal of the left sound channel power supply and the time sequence signal of the right sound channel power supply includes:

determining a number of pulses corresponding to the clock signal at the first rising or falling edge of the time sequence signal of the first sound channel power supply, and acquiring the time of the first rising or falling edge of the time sequence signal of the first sound channel power supply; and receiving time of a first rising or falling edge of a time sequence signal of a second sound channel power supply, the second sound channel power supply being the other of the left sound channel power supply and the right sound channel power supply.

In the embodiment of the present disclosure, the time of the first rising or falling edge of the time sequence signal of the power supply is determined by counting the number of pulses of the clock signal. Since this method is executed by the processor in one of the power amplifier circuits, the one processor may acquire the time of the first rising or falling edge of the time sequence signal of one power supply by counting in the above manner. For the time of the first rising or falling edge of the time sequence signal of the other power supply, it may be acquired by the processor in the other power amplifier circuit through counting, and then transmitted to the one processor.

In some embodiments, determining the offset between the time sequence signal of the left sound channel power supply and the time sequence signal of the right sound channel power supply includes:

calculating a difference value between the time of the first rising or falling edges of the time sequence signal of the left sound channel power supply and the time sequence signal of the right sound channel power supply; and acquiring the offset by adding the difference value to a transmission delay between a power amplifier circuit of the left sound channel and a power amplifier circuit of the right sound channel.

In this implementation, because there is a transmission delay in the transmission of the clock signal from one power amplifier circuit to the other, the transmission delay shall be considered while calculating the offset between the time sequence signals of the left sound channel power supply and the right sound channel power supply, so that the accuracy of the offset between the time sequence signals of the left sound channel power supply and the right sound channel power supply may be ensured.

In some embodiments, the target offset is half a cycle of the time sequence signal.

In this implementation, the time sequence signals generated by the left sound channel power supply and the right sound channel power supply are controlled to be different by half a cycle, so that the peak of the ripple of one power supply is superposed to the valley of the ripple of the other power supply, thereby minimizing the ripple effect.

In some embodiments, the method further includes:

controlling the transistor in the first sound channel power supply to be turned on after half a cycle of turning on the transistor in the second sound channel power.

In this implementation, the time of turning on the switches of the two sound channel power supplies is controlled to be staggered by half a cycle, so that the peak of ripples of one power supply is superposed to the valley of the ripple of the other power supply, thereby minimizing the ripple effect.

It should be noted that the aforesaid steps 101 to 103 and the aforesaid optional steps may be arbitrarily combined.

Figure 5:
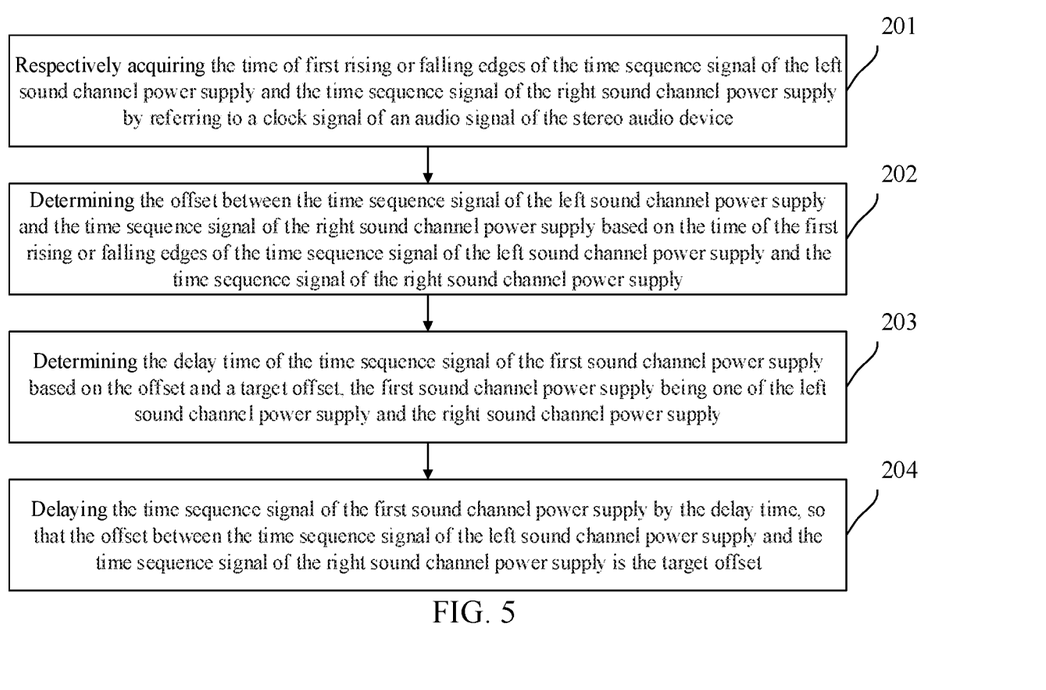
FIG. 5 is a flowchart of a power control method for a stereo audio device according to some embodiments.

FIG. 5 is a flowchart of a power control method for a stereo audio device according to some embodiments. Referring to FIG. 5, the method is executed by the aforesaid audio device, and the method includes steps as follows.

In step 201, the time of first rising or falling edges of the time sequence signal of the left sound channel power supply and the time sequence signal of the right sound channel power supply is acquired respectively by referring to a clock signal of an audio signal of the stereo audio device.

Since processors of the two power amplifier circuits control the operation of two power supplies separately and have no synchronization signal therebetween, the offset between the time sequence signals of the left sound channel power supply and the right sound channel power supply is random each time. Therefore, each time this method is adopted, the offset between the time sequence signals of the left sound channel power supply and the right sound channel power supply must be determined firstly. In particular, the clock signal of the audio signal may be taken as a reference. Then, with the reference, the time of the first rising or falling edges of the time sequence signal of the left sound channel power supply and the time sequence signal of the right sound channel power supply may be acquired, so that the offset may then be determined based on the time of the first rising edge or falling edges as acquired. In addition, by taking the clock signal of the audio signal as the reference, it can be ensured that the time of the first rising or falling edges of the time sequence signal of the left sound channel power supply and the time sequence signal of the right sound channel power supply is acquired by taking the same time reference as the reference, which can ensure that the offset between time sequence signals of the two power supplies can be accurately determined each time, thereby making it ready for subsequent control.

In the embodiment of the present disclosure, steps 201 to 204 in this method may be executed by the processor in the power amplifier circuit corresponding to the first sound channel power supply.

In some embodiments, respectively acquiring the time of the first rising or falling edges of the time sequence signal of the left sound channel power supply and the time sequence signal of the right sound channel power supply includes:

determining a number of pulses corresponding to the clock signal at the first rising or falling edge of the time sequence signal of the first sound channel power supply, and acquiring the time of the first rising or falling edge of the time sequence signal of the left sound channel power supply; and receiving time of a first rising or falling edge of a time sequence signal of a second sound channel power supply, the second sound channel power supply being the other one of the left sound channel power supply and the right sound channel power supply.

In the embodiment of the present disclosure, the time of the first rising or falling edge of the time sequence signal of the power supply is determined by counting the number of pulses of the clock signal. Since this method is executed by the processor in one of the power amplifier circuits, the one processor may acquire the time of the first rising or falling edge of the time sequence signal of one power supply by counting in the above manner. For the time of the first rising or falling edge of the time sequence signal of the other power supply, it may be acquired by the processor in the other power amplifier circuit through counting, and then transmitted to the one processor.

In addition to the I2S bus for transmitting audio signals, the first power amplifier circuit and the second power amplifier circuit also have a data signal transmission interface therebetween. The second power amplifier circuit may transmit the time to the processor of the first power amplifier circuit through the data signal transmission interface.

In step 202, the offset between the time sequence signal of the left sound channel power supply and the time sequence signal of the right sound channel power supply is determined based on the time of the first rising or falling edges of the time sequence signal of the left sound channel power supply and the time sequence signal of the right sound channel power supply.

In some embodiments, determining the offset between the time sequence signal of the left sound channel power supply and the time sequence signal of the right sound channel power supply includes:

calculating a difference value between the time of the first rising or falling edges of the time sequence signal of the left sound channel power supply and the time sequence signal of the right sound channel power supply; and acquiring the offset by adding the difference value to a transmission delay between a power amplifier circuit of the left sound channel and a power amplifier circuit of the right sound channel.

In this implementation, because there is a transmission delay in the transmission of the clock signal from one power amplifier circuit to the other, the transmission delay, shall be considered while calculating the offset between the time sequence signals of the left sound channel power supply and the right sound channel power supply, so that the accuracy of the offset between the time sequence signals of the left sound channel power supply and the right sound channel power supply can be ensured.

For example, if the turn-on time of the left sound channel power supply is the third pulse of the clock signal and the turn-on time of the right sound channel power supply is the fifth pulse of the clock signal, the turn-on time difference between the two power supplies is two pulses multiplied by the cycle of the clock signal, and the transmission delay is then added.

In an implementation of the embodiment of the present disclosure, the transmission delay may be detected in advance and stored in the processor. The detection method may include: inputting a pulse test signal to the first power amplifier circuit; transmitting the pulse test signal to the second power amplifier circuit by the first power amplifier circuit; connecting the two power amplifier circuits to an oscilloscope at the same time; and determining the transmission delay based on the time difference in the waveform of the oscilloscope.

In an implementation of the embodiment of the present disclosure, the transmission delay may also be stored in the host and then transmitted to the processor of the power amplifier circuit by the host.

In step 203, the delay time of the time sequence signal of the first sound channel power supply is determined based on the offset and a target offset, the first sound channel power supply being one of the left sound channel power supply and the right sound channel power supply.

The offset between the time sequence signals of the two power supplies is t1, and the target offset is t2.

The method may include: when the first rising or falling edge of the time sequence signal of the first sound channel power supply is earlier than the first rising or falling edge of the time sequence signal of the second sound channel power supply, the delay time is 2t2−t1 if t2 is greater than or equal to t1, and the delay time is t2−t1 if t2 is less than t1.

When the first rising or falling edge of the time sequence signal of the first sound channel power supply is later than the first rising or falling edge of the time sequence signal of the second sound channel power supply, the delay time is t2−t1 if t2 is greater than or equal to t1; and the delay time is 2t2−t1 if t2 is less than t1.

When the first rising or falling edge of the time sequence signal of the first sound channel power supply occurs at the same time of the first rising or falling edge of the time sequence signal of the second sound channel power supply, the delay time is t2.

It should be noted that, during the aforesaid adjustment process, for example, if it is determined that the adjustment time is T, the delay time that may be used in actual adjustment may also be T+nt0 besides the T, where n is an integer, t0 is the cycle time of the time sequence signal, and T+nt0 is a non-negative value.

In step 204, the time sequence signal of the first sound channel power supply is delayed by the delay time, so that the offset between the time sequence signal of the left sound channel power supply and the time sequence signal of the right sound channel power supply is the target offset.

When the offset between the time sequence signal of the left sound channel power supply and the time sequence signal of the right sound channel power supply is the target offset, the peak of superposed ripples generated by the left sound channel power supply and the right sound channel power supply is less than or equal to the peak of ripple generated by the left sound channel power supply or the right sound channel power supply.

In some embodiments, the target offset is half a cycle of the time sequence signal.

In this implementation, the time sequence signals generated by the left sound channel power supply and the right sound channel power supply are controlled to be different by half a cycle, so that the peak of the ripple of one power supply is superposed to the valley of the ripple of the other power supply, thereby minimizing the ripple effect.

Herein, the time of one cycle refers to the time interval between the two times of turning on the switch by the time sequence signal, which may be acquired by the processor in advance.

As described above, controlling the time sequence signals of the left sound channel power supply and the right sound channel power supply to be different by half a cycle is merely an example herein. In practice, as long as the target offset falls within the target range, the target range may ensure that the peak of superposed ripples generated by the left sound channel power supply and the right sound channel power supply is less than or equal to the peak of ripple generated by the left sound channel power supply or the right sound channel power supply.

The audio device adopts the delayed time sequence signal of the first sound channel power supply to control the switch of the first sound channel power supply. That is, the method may further include:

controlling the transistor in the second sound channel power supply to be turned on by the processor in the power amplifier circuit corresponding to the first sound channel power supply; and controlling the transistor in the first sound channel power supply to be turned on by the processor in the power amplifier circuit corresponding to the second sound channel power supply after half a cycle of turning on the transistor in the second sound channel power.

In this implementation, the time of turning on the switch of the two sound channel power supplies is controlled to be staggered by half a cycle, so that the peak of ripple of one power supply is superposed to the valley of the ripple of the other power supply, thereby minimizing the ripple effect.

Figure 6:
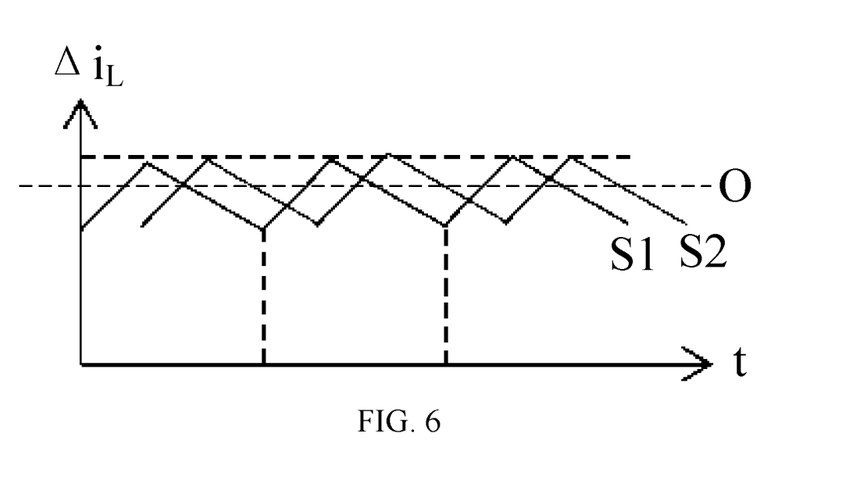
FIG. 6 is a waveform diagram of ripples according to some embodiments of the present disclosure.

FIG. 6 is a waveform diagram of ripples according to some embodiments of the present disclosure. Referring to FIG. 6, S1 and S2 respectively represent ripple waveforms of the two power supplies. The ripple waveforms tend to vary in cycles. Generally, the peak of the ripple current is positive, and the valley is negative. As shown in FIG. 6, the current corresponding to O is 0, and the peak of one ripple waveform corresponds to the negative value of the other ripple, so that the peak is reduced due to the superposition, which reduces the ripple interference and prevents the audio circuit or the host from the incapability of operation caused by excessive ripple fluctuations.

Figure 7:
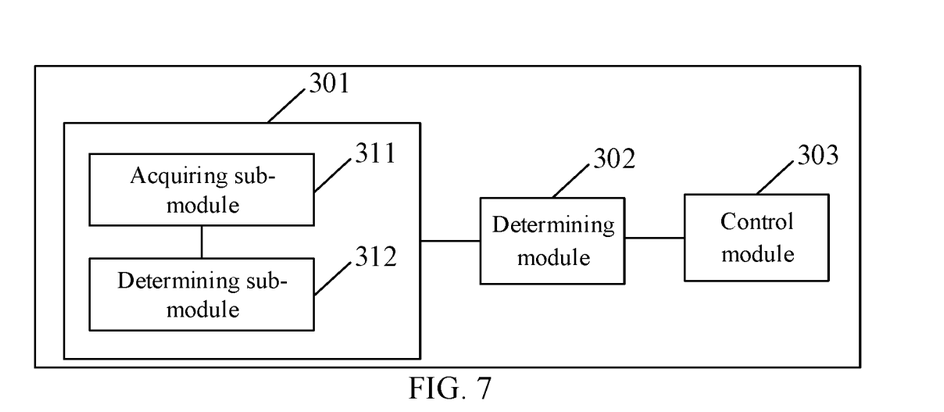
FIG. 7 is a structure diagram of a power control apparatus for a stereo audio device according to some embodiments.

FIG. 7 is a structure diagram of a power control apparatus for a stereo audio device according to some embodiments. The device has a function of implementing the audio device according to the aforesaid method embodiment, and the function may be implemented by hardware, or may be implemented by corresponding software executed by the hardware. As shown in FIG. 7, the apparatus includes an acquiring module 301, a determining module 302, and a controlling module 303.

The acquiring module 301 is configured to acquire an offset between a time sequence signal of a left sound channel power supply and a time sequence signal of a right sound channel power supply, the left sound channel power supply and the right sound channel power supply both being switch power supplies, and the time sequence signal being used for controlling on and off of transistors in the switch power supplies.

The determining module 302 is configured to determine a delay time of a time sequence signal of a first sound channel power supply based on the offset and a target offset, the first sound channel power supply being one of the left sound channel power supply and the right sound channel power supply.

The control module 303 is configured to control operating time sequences of the left sound channel power supply and the right sound channel power supply by using the turn-on time difference, so that a peak of superposed ripples generated by the left sound channel power supply and the right sound channel power supply after control is less than or equal to a peak of ripples generated by the left sound channel power supply or the right sound channel power supply.

In some embodiments, the acquiring module 301 includes:

an acquiring sub-module 311 configured to respectively acquire time of first rising or falling edges of the time sequence signal of the left sound channel power supply and the time sequence signal of the right sound channel power supply, by referring to a clock signal of an audio signal of the stereo audio device; and a determining sub-module 312 configured to determine the offset between the time sequence signal of the left sound channel power supply and the time sequence signal of the right sound channel power supply based on the time of the first rising or falling edges of the time sequence signal of the left sound channel power supply and the time sequence signal of the right sound channel power supply.

In some embodiments, the acquiring sub-module 311 is configured to determine a number of pulses corresponding to the clock signal at the first rising or falling edge of the time sequence signal of the first sound channel power supply to acquire the time of the first rising or falling edge of the time sequence signal of the left sound channel power supply, and receive time of a first rising or falling edge of a time sequence signal of a second sound channel power supply, the second sound channel power supply being the other of the left sound channel power supply and the right sound channel power supply.

In some embodiments, the determining sub-module 312 is configured to calculate a difference value between the time of the first rising or falling edges of the time sequence signal of the left sound channel power supply and the time sequence signal of the right sound channel power supply, and acquire the offset by adding the difference value to a transmission delay between a power amplifier circuit of the left sound channel and a power amplifier circuit of the right sound channel.

In some embodiments, the target offset is half a cycle of the time sequence signal.

In some embodiments, the control module 303 is further configured to control the transistor in the first sound channel power supply to be turned on after half a cycle of turning on the transistor in the second channel power.

Figure 8:
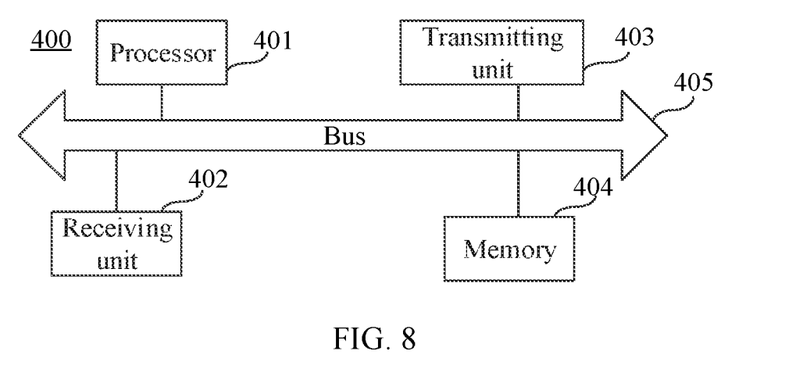
FIG. 8 is a block diagram of an audio device according to some embodiments.

Reference is made to FIG. 8, which shows a block diagram of an audio device 400 according to one exemplary embodiment. The audio device may be the aforesaid loudspeaker box or loudspeaker unit. The audio device 400 may include a processor 401, a receiving unit 402, a transmitting unit 403, a memory 404 and bus 405.

The processor 401 includes one or more processing cores. The processor 401 performs various function applications and information processing by running software programs and modules.

The receiving unit 402 and the transmitting unit 403 may be realized as a communication component which may be a communication chip.

The memory 404 is connected with the processor 401 via the bus 405.

The memory 404 is configured to store at least one instruction. The processor 401 is configured to execute the at least one instruction to realize the steps of the above method embodiments.

In addition, the memory 404 may be implemented by any type of volatile or non-volatile storage devices or combinations thereof, which include, but are not limited to: a magnetic or optical disk, an electrically erasable programmable read-only memory (EEPROM), an erasable programmable read-only memory (EPROM), a static anytime access memory (SRAM), a read-only memory (ROM), a magnetic memory, a flash memory, or a programmable read-only memory (PROM).

Some embodiments of the present disclosure further provide a computer-readable storage medium. At least one instruction, at least one program, a code set or an instruction set is stored in the storage medium and loaded and executed by the processor to implement the power control method for a stereo audio device according to the above method embodiments of the present disclosure.

Some embodiments of the present disclosure further provide a mobile terminal including a stereo audio device which may perform the actions described in the above method embodiments.

In some embodiments, acquiring the offset between the time sequence signal of the left sound channel power supply and the time sequence signal of the right sound channel power supply comprises:

respectively acquiring time of first rising or falling edges of the time sequence signal of the left sound channel power supply and the time sequence signal of the right sound channel power supply by referring to a clock signal of an audio signal of the stereo audio device; and determining the offset between the time sequence signal of the left sound channel power supply and the time sequence signal of the right sound channel power supply based on the time of the first rising or falling edges of the time sequence signal of the left sound channel power supply and the time sequence signal of the right sound channel power supply.

In some embodiments, respectively acquiring the time of the first rising or falling edges of the time sequence signal of the left sound channel power supply and the time sequence signal of the right sound channel power supply includes:

determining a number of pulses corresponding to the clock signal at a first rising or falling edge of the time sequence signal of the first sound channel power supply to acquire the time of the first rising or falling edge of the time sequence signal of the left sound channel power supply; and receiving time of a first rising or falling edge of a time sequence signal of a second sound channel power supply, the second sound channel power supply being the other one of the left sound channel power supply and the right sound channel power supply.

In some embodiments, determining the offset between the time sequence signal of the left sound channel power supply and the time sequence signal of the right sound channel power supply includes:

calculating a difference value between the time of the first rising or falling edges of the time sequence signal of the left sound channel power supply and the time sequence signal of the right sound channel power supply; and acquiring the offset by adding the difference value to a transmission delay between a power amplifier circuit of the left sound channel and a power amplifier circuit of the right sound channel.

In some embodiments, the target offset is half a cycle of the time sequence signal.

In some embodiments, the method further includes: controlling the transistor in the first sound channel power supply to be turned on after half a cycle of turning on the transistor in the second sound channel power.

In some embodiments, the acquiring module includes:

an acquiring sub-module configured to respectively acquire time of first rising or falling edges of the time sequence signal of the left sound channel power supply and the time sequence signal of the right sound channel power supply by referring to a clock signal of an audio signal of the stereo audio device; and a determining sub-module configured to determine the offset between the time sequence signal of the left sound channel power supply and the time sequence signal of the right sound channel power supply based on the time of the first rising or falling edges of the time sequence signal of the left sound channel power supply and the time sequence signal of the right sound channel power supply.

In some embodiments, the acquiring sub-module is configured to determine a number of pulses corresponding to the clock signal at a first rising or falling edge of the time sequence signal of the first sound channel power supply to acquire the time of the first rising or falling edge of the time sequence signal of the left sound channel power supply, and receive time of a first rising or falling edge of a time sequence signal of a second sound channel power supply, the second sound channel power supply being the other one of the left sound channel power supply and the right sound channel power supply.

In some embodiments, the determining sub-module is configured to calculate a difference value between the time of the first rising or falling edges of the time sequence signal of the left sound channel power supply and the time sequence signal of the right sound channel power supply, and acquire the offset by adding the difference value to a transmission delay between a power amplifier circuit of the left sound channel and a power amplifier circuit of the right sound channel.

In some embodiments, the target offset is half a cycle of the time sequence signal.

As such, the two power supplies of a mobile terminal, which are boost power supplies, can supply power to the two power amplifiers, designated as a master smart power amplifier (PA), and a slave smart PA. The master smart PA and the slave smart PA are configured to communicate with each other to have the target offset half a cycle of the time sequence signal, causing a damping of the ripples, thereby avoiding a random superposition of the ripples.

In some embodiments, the control module is further configured to control the transistor in the first sound channel power supply to be turned on after half a cycle of turning on the transistor in the second sound channel power.

According to an aspect of embodiments of the present disclosure, a non-transitory computer-readable storage medium is provided, and when instructions in the computer-readable storage medium are executed by a processor, the power control method for the stereo audio device as described above may be executed.

Various embodiments of the present application can have one or more of the following advantages.

For example, left and right sound channels of the stereo audio device are powered by independent switch power supplies. The power supplies may generate ripples during operation, and the superposition of ripples generated by two independent power supplies will strengthen this kind of interference. According to the embodiments of the present disclosure, by acquiring the offset between the time sequence signals of the two power supplies, the time sequence signal of one power supply is controlled to be delayed, so that the peak of superposed ripples generated by the left sound channel power supply and the right sound channel power supply is less than or equal to the peak of ripple generated by the left sound channel power supply or the right sound channel power supply, thereby reducing the ripple interference and avoiding incapability of operation caused by excessive ripple fluctuations.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon is further provided. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A power control method for a stereo audio device, comprising:

acquiring an offset between a time sequence signal of a left sound channel power supply and a time sequence signal of a right sound channel power supply, the left sound channel power supply and the right sound channel power supply both being switch power supplies, and the time sequence signal being used for controlling on and off of transistors in the switch power supplies;

determining a delay time of a time sequence signal of a first sound channel power supply based on the offset and a target offset, the first sound channel power supply being one of the left sound channel power supply and the right sound channel power supply; and delaying the time sequence signal of the first sound channel power supply by the delay time to meet the target offset; wherein when the offset between the time sequence signal of the left sound channel power supply and the time sequence signal of the right sound channel power supply is the target offset, a peak of superposed ripples generated by the left sound channel power supply and the right sound channel power supply is not greater than a peak of ripple generated by one of the left sound channel power supply and the right sound channel power supply.

2. The method according to claim 1, wherein the acquiring the offset between the time sequence signal of the left sound channel power supply and the time sequence signal of the right sound channel power supply comprises:
respectively acquiring time of first rising or falling edges of the time sequence signal of the left sound channel power supply and the time sequence signal of the right sound channel power supply by referring to a clock signal of an audio signal of the stereo audio device; and
determining the offset between the time sequence signal of the left sound channel power supply and the time sequence signal of the right sound channel power supply based on the time of the first rising or falling edges of the time sequence signal of the left sound channel power supply and the time sequence signal of the right sound channel power supply.

3. The method according to claim 2, wherein the respectively acquiring the time of the first rising or falling edges of the time sequence signal of the left sound channel power supply and the time sequence signal of the right sound channel power supply comprises:
determining a number of pulses corresponding to the clock signal at a first rising or falling edge of the time sequence signal of the first sound channel power supply to acquire the time of the first rising or falling edge of the time sequence signal of the first sound channel power supply; and
receiving time of a first rising or falling edge of a time sequence signal of a second sound channel power supply, the second sound channel power supply being the other one of the left sound channel power supply and the right sound channel power supply.

4. The method according to claim 2, wherein the determining the offset between the time sequence signal of the left sound channel power supply and the time sequence signal of the right sound channel power supply comprises:
calculating a difference value between the time of the first rising or falling edges of the time sequence signal of the left sound channel power supply and the time sequence signal of the right sound channel power supply; and
acquiring the offset by adding the difference value to a transmission delay between a power amplifier circuit of the left sound channel and a power amplifier circuit of the right sound channel.

5. The method according to claim 3, wherein the target offset is half a cycle of the time sequence signal.

6. The method according to claim 5, further comprising:
controlling a transistor in the first sound channel power supply to be turned on after half a cycle of turning on a transistor in the second sound channel power.

7. A stereo audio device, comprising:
a processor;
memory for storing a processor-executable instruction, wherein
the processor is configured to load and execute the executable instruction and to:
acquire an offset between a time sequence signal of a left sound channel power supply and a time sequence signal of a right sound channel power supply, the left sound channel power supply and the right sound channel power supply both being switch power supplies, and the time sequence signal being used for controlling on and off of transistors in the switch power supplies;
determine a delay time of a time sequence signal of a first sound channel power supply based on the offset and a target offset, the first sound channel power supply being one of the left sound channel power supply and the right sound channel power supply; and
delay the time sequence signal of the first sound channel power supply by the delay time to meet the target offset; wherein when the offset between the time sequence signal of the left sound channel power supply and the time sequence signal of the right sound channel power supply is the target offset, a peak of superposed ripples generated by the left sound channel power supply and the right sound channel power supply is not greater than a peak of ripple generated by one of the left sound channel power supply and the right sound channel power supply.

8. The device according to claim 7, wherein the processor is further configured to:
respectively acquire time of first rising or falling edges of the time sequence signal of the left sound channel power supply and the time sequence signal of the right sound channel power supply by referring to a clock signal of an audio signal of the stereo audio device; and
determine the offset between the time sequence signal of the left sound channel power supply and the time sequence signal of the right sound channel power supply based on the time of the first rising or falling edges of the time sequence signal of the left sound channel power supply and the time sequence signal of the right sound channel power supply.

9. The device according to claim 8, wherein the processor is further configured to determine a number of pulses corresponding to the clock signal at a first rising or falling edge of the time sequence signal of the first sound channel power supply to acquire the time of the first rising or falling edge of the time sequence signal of the left sound channel power supply, and receive time of a first rising or falling edge of a time sequence signal of a second sound channel power supply, the second sound channel power supply being the other one of the left sound channel power supply and the right sound channel power supply.

10. The device according to claim 8, wherein the processor is further configured to calculate a difference value between the time of the first rising or falling edges of the time sequence signal of the left sound channel power supply and the time sequence signal of the right sound channel power supply, and acquire the offset by adding the difference value to a transmission delay between a power amplifier circuit of the left sound channel and a power amplifier circuit of the right sound channel.

11. The device according to claim 9, wherein the target offset is half a cycle of the time sequence signal.

12. The device according to claim 11, wherein the processor is further configured to control the transistor in the first sound channel power supply to be turned on after half a cycle of turning on the transistor in the second sound channel power.

13. A mobile terminal, comprising a stereo audio device, the device comprising:
a processor;
memory storing instructions for execution by the processor to:
acquire an offset between a time sequence signal of a left sound channel power supply and a time sequence signal of a right sound channel power supply, the left sound channel power supply and the right sound channel power supply both being switch power supplies, and the time sequence signal being used for controlling on and off of transistors in the switch power supplies;

determine a delay time of a time sequence signal of a first sound channel power supply based on the offset and a target offset, the first sound channel power supply being one of the left sound channel power supply and the right sound channel power supply; and delay the time sequence signal of the first sound channel power supply by the delay time to meet the target offset; wherein when the offset between the time sequence signal of the left sound channel power supply and the time sequence signal of the right sound channel power supply is the target offset, a peak of superposed ripples generated by the left sound channel power supply and the right sound channel power supply is not greater than a peak of ripple generated by one of the left sound channel power supply and the right sound channel power supply.

14. A non-transitory computer-readable storage medium storing instructions for execution by a processing circuit to implement the power control method for the stereo audio device according to claim 1.

15. The method according to claim 1, wherein the target offset is half a cycle of the time sequence signal.

16. The device according to claim 7, wherein the target offset is half a cycle of the time sequence signal.

17. A mobile terminal implementing the method of claim 1 and comprising the stereo audio device, wherein the left and right sound channels of the stereo audio device are powered by independent switch power supplies.

18. The mobile terminal of claim 17, wherein the independent switch power supplies have superposition of ripples during operation, and wherein the mobile terminal is configured to acquire the offset between the time sequence signals of the two power supplies, and control the time sequence signal of one power supply to be delayed, to thereby reduce the peak of superposed ripples generated by the left sound channel power supply and the right sound channel power supply, and avoid incapability of operation caused by excessive ripple fluctuations.

19. The mobile terminal of claim 18, wherein the two power supplies are boost power supplies, and the mobile terminal further comprises a master smart power amplifier (PA), and a slave smart PA, respectively controlled by the two boost power supplies.

20. The mobile terminal of claim 19, wherein the master smart PA and the slave smart PA are configured to communicate with each other to have the target offset half a cycle of the time sequence signal, causing a damping of the ripples, thereby avoiding a random superposition of the ripples, wherein a current amplitude of the ripple is described as $$\Delta i_L = \frac{V_{IN} - V_{sw}}{L} \frac{D}{f_s};$$

and wherein $V_{in}$ refers to input voltage of the circuit; $V_{sw}$ refers to source-drain voltage of the transistor T0 in the circuit; L refers to magnitude of the inductor; D refers to duty ratio; and $f_s$ refers to frequency.

\* \* \* \* \*